United States Patent [19]
Hobson

[11] Patent Number: 5,754,468
[45] Date of Patent: May 19, 1998

[54] COMPACT MULTIPORT STATIC RANDOM ACCESS MEMORY CELL

[75] Inventor: Richard F. Hobson, Coquitlam, Canada

[73] Assignee: Simon Fraser University, Burnaby, Canada

[21] Appl. No.: 673,732

[22] Filed: Jun. 26, 1996

[51] Int. Cl.⁶ ................................................. G11C 11/00
[52] U.S. Cl. ..................... 365/156; 365/154; 365/230.05; 257/903
[58] Field of Search ........................... 365/156, 154, 365/230.05; 257/903, 904

[56] References Cited

U.S. PATENT DOCUMENTS 4,779,226  10/1988  Haraszti ............................. 365/156
5,355,331  10/1994  Takase et al. ....................... 365/154
5,555,208   9/1996  Nishihara .......................... 365/156

*Primary Examiner*—David C. Nelms
*Assistant Examiner*—Huan Hoang
*Attorney, Agent, or Firm*—Stephen T. Sullivan

[57] ABSTRACT

A new static random access memory cell for standard logic CMOS processes with three or more metal layers is detailed. The method uses three P-type and three N-type MOS transistors to form a two-port memory cell, which can be configured to perform as a one port, or a two port memory cell. In addition to standard memory applications, specialty memories, like a First-In First-Out (FIFO) buffer, which can benefit from the natural 2-port structure of our invention, are particularly appealing. Additional ports can be added for applications like a 3-port microprocessor register array.

7 Claims, 4 Drawing Sheets

COMPACT MULTIPORT STATIC RANDOM ACCESS MEMORY CELL

FIELD

The present invention relates to a compact multiport Static Random Access Memory cell having a physical layout which utilizes a relatively small chip area.

BACKGROUND

Static Random Access Memory (SRAM) is a vital element in VLSI systems design. Today's Field Programmable Gate Arrays (FPGA's) have large amounts of logic capability, but are quite limited when it comes to the deployment of SRAM. The ability to deploy varying amounts of SRAM or other special functions is what makes semi-custom, or full-custom VLSI design attractive for some applications.

The traditional CMOS SRAM storage cell (prior art) is composed of 6 MOS transistors as shown in FIG. 1. NMOS transistor N2 is connected in series to PMOS transistor P1, while NMOS transistor N3 is connected in series to PMOS transistor P2. The gate of transistor N2 is coupled to junction A while that of N3 is connected to junction B. NMOS transistors N1 and N4 act as switches responsive to the signal level on word line 12. Bit or data lines 14 and 16 serve to detect the voltage on junctions A and B, respectively. The voltage levels on data lines 14 and 16 are also used to force a desired state change onto the transistors N2 and N3. PMOS transistors P1 and P2 serve to help maintain complementary voltages on the nodes A and B, respectively. The cell shown in FIG. 1 is not complete by itself; it must be connected up in an array. FIG. 2 shows a possible physical layout for the traditional SRAM storage cell using a standard logic process technology (e.g. Jarvis Tou, Perry Gee, John Dun, and Rick Eesley, "A Sub-Micron CMOS Embedded SRAM Compiler", Proceedings 1991 Custom Integrated Circuits Conference, pp. 22.3.1-22.3.4). This technique typically shows transistor pairs (N1,N2), (N3,N4) forming a right angle in the physical layout. Power VDD and ground VSS connections are distributed over several cells (perhaps 4) to help reduce area. Thus, no contacts are shown for VDD, only a diffusion layer connection. The technology used in FIG. 2 provides one layer of polysilicon, and two layers of metal.

Commercial versions of this SRAM often have special features to reduce its area, since area is the main obstacle to designing chips with large amounts of SRAM. One special feature is the use of an extra layer called "local interconnect". This layer helps to reduce the area taken by the cross-coupled inverters that form the central part of an SRAM cell. Local interconnect is usually not available in a standard logic CMOS technology, so very compact SRAM cells are more difficult to achieve.

Another commercially used technique for SRAM area reduction is to replace the p-channel pull-ups (P1, P2) in the cross-coupled inverters with a pair of very high resistance resistors. These devices are usually "grown" on top of other parts of the cell to help reduce area. Again, this technique is not available in standard logic technology.

Modern logic process technology has been evolving towards the use of more interconnect layers, and more compact interlayer connection techniques. As new interconnection layers are added, designers can rethink how circuits are traditionally implemented, perhaps coming up with more compact and/or faster implementations.

SUMMARY OF THE INVENTION

According to the invention there is provided a static random access memory cell having two NMOS transistors each having a source coupled to ground and a gate of each coupled to a drain of the other. A pair of PMOS transistors are coupled from each of the drains to VDD with a pair of data access transistors are coupled between respective ones of two data lines to associated ones of the gates of the NMOS transistors with separate word lines coupled to gates of the two data access transistors, wherein one of the data access transistors is a PMOS transistor.

Advantageously, the PMOS transistors, which function as pullup devices, each have a drain coupled to a drain of an associated one of the NMOS transistors, a source coupled to VDD and a gate coupled to the gate of the associated one of the NMOS transistors.

Preferably, the three PMOS transistors are laid out so that they are substantially in-line, and the three NMOS transistors are also laid out so that they are substantially in-line but spaced apart from the PMOS transistors.

The number of metal process layers may be three.

A ground line may run through a column of cells in one layer of metal, and a power (VDD) line running through a row of cells in a different layer of metal.

Separate single-ended read and write data lines run horizontally through each row said cells with said power (VDD) line and are formed from the same metal layer as said power line.

There are three metal layers of interconnect, separate write-enable and read-enable signals, as well as separate single-ended buses for write (wr_data) and read (rd_data). Thus, this memory cell has two separate ports. These ports can be used separately, if separate address decoders are implemented, or together if a single address decoder is used for both read and write. Conventional SRAM cells can also be made multiported, but the substrate area they occupy increases rapidly.

BRIEF DESCRIPTION OF THE DRAWINGS

The novel features believed characteristic of the invention are set forth in the appended claims. The invention itself, however, as well as other features and advantages thereof, would be best understood by reference to the detailed description which follows, read in conjunction with the accompanying drawings, wherein:

DETAILED DESCRIPTION WITH REFERENCE TO THE DRAWINGS

Figure 1:
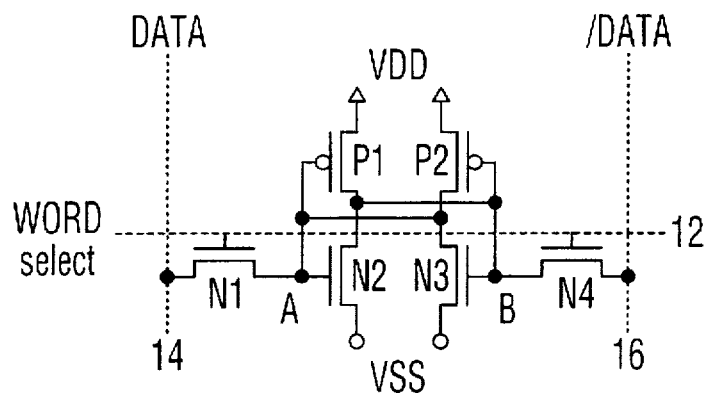
FIG. 1 is a schematic drawing of a known six transistor SRAM cell.
Figure 2:
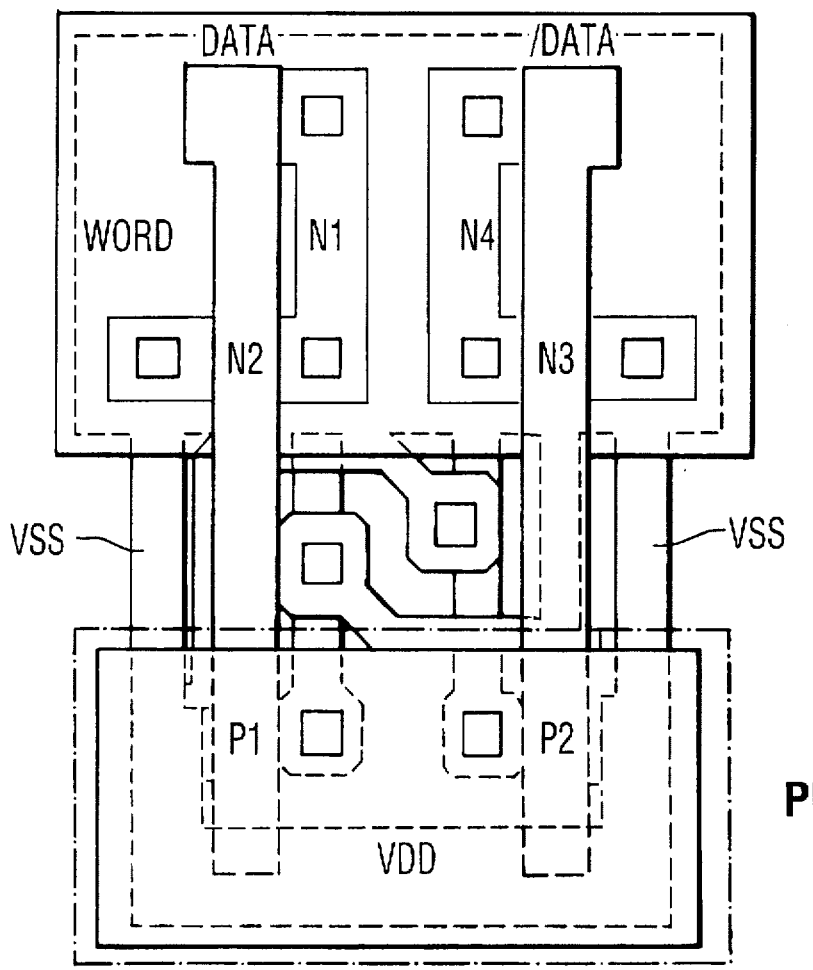
FIG. 2 is a schematic diagram of a typical physical layout of a prior art SRAM cell.
Figure 3:
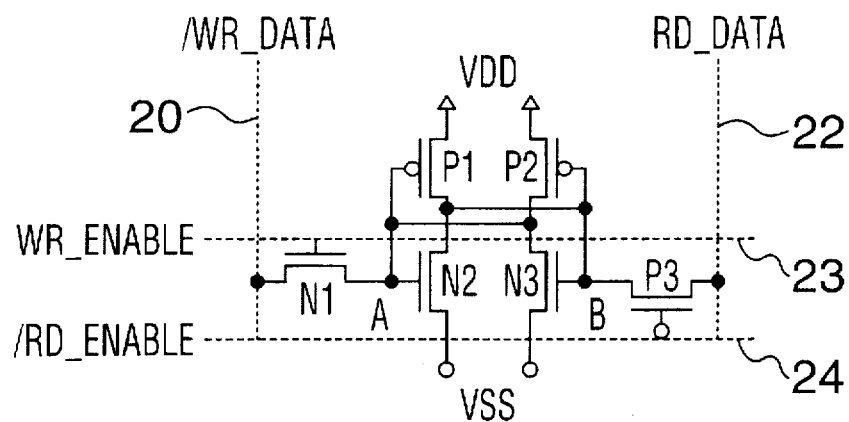
FIG. 3 is a schematic diagram of a six transistor two port SRAM cell.

Referring to FIG. 3, which is a schematic upon which a preferred embodiment is based, the NMOS transistor N4 of FIG. 1 is replaced by a PMOS transistor P3 so as to provide separate write-enable 23 and read-enable 24 lines as well as separate single-ended buses 20 and 22 for write (wr_data) and read (rd_data).

Figure 4:
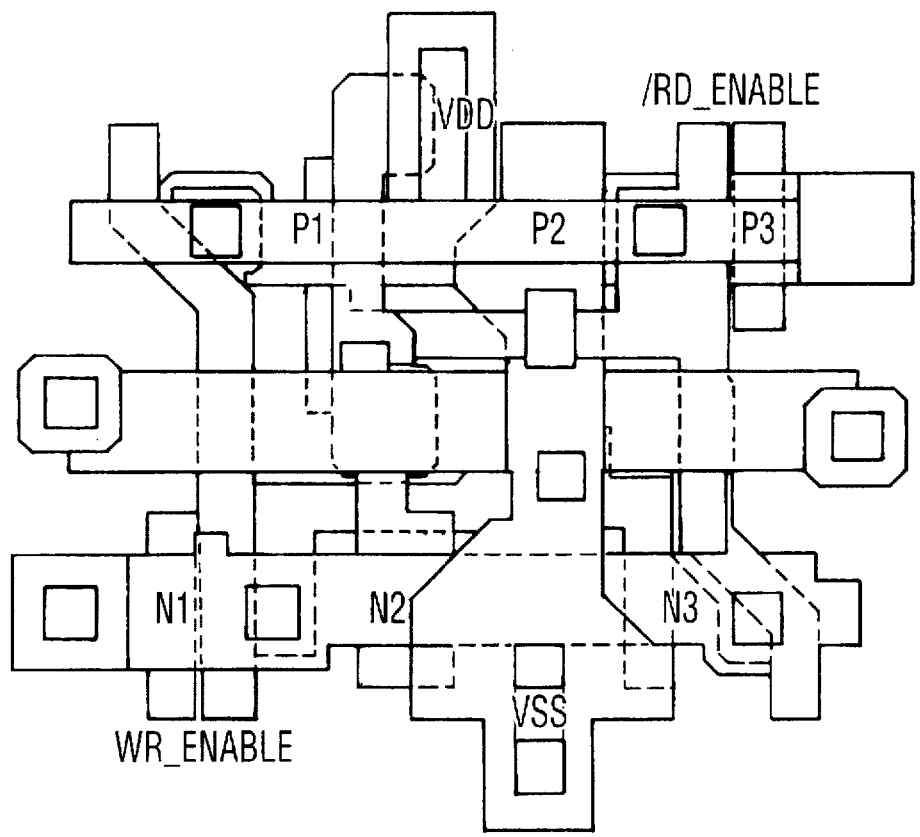
FIG. 4 is a schematic diagram of a possible physical layout of the six transistor two port SRAM cell of FIG. 3.

For the physical implementation of the cell corresponding to FIG. 3 (note this structure is intended to be used in groups with additional connections put in later), it is possible to provide three substantially in-line transistors of N-type and three substantially in-line transistors of P-type as seen in FIG. 4. The two sets of three transistors of identical type together with a special method to connect adjacent devices together (see below), results in a reduced cell area. The area of the cell of FIG. 4 (when considered as part of a 1-port memory) is comparable but less than a 1-port prior-art style of SRAM cell published by BNR researchers who use the same process rules as are used for the cell of FIG. 4. (cf. A. Silburt et al, "A 180-MHz 0.8 micron BiCMOS Modular Memory Family of DRAM and Multiport SRAM", IEEE J. Solid State Circuits, V. 28, No. 3, March 1993, pp 222–232). The BNR cell was reported with an area of 131.3 square microns while the present cell can be implemented in the same process using as little as 115.3 square microns for an area saving of over 12%. Much larger area savings (over 30%) are obtained when a real two port memory cell is needed because the prior art cell requires another pair of data bus signals and another pair of access transistors (like N1, N4 of FIG. 1), for each port. The prior art cell can perform both read and write from each port, whereas the current invention has separate ports for each read and write connection.

Figure 5:
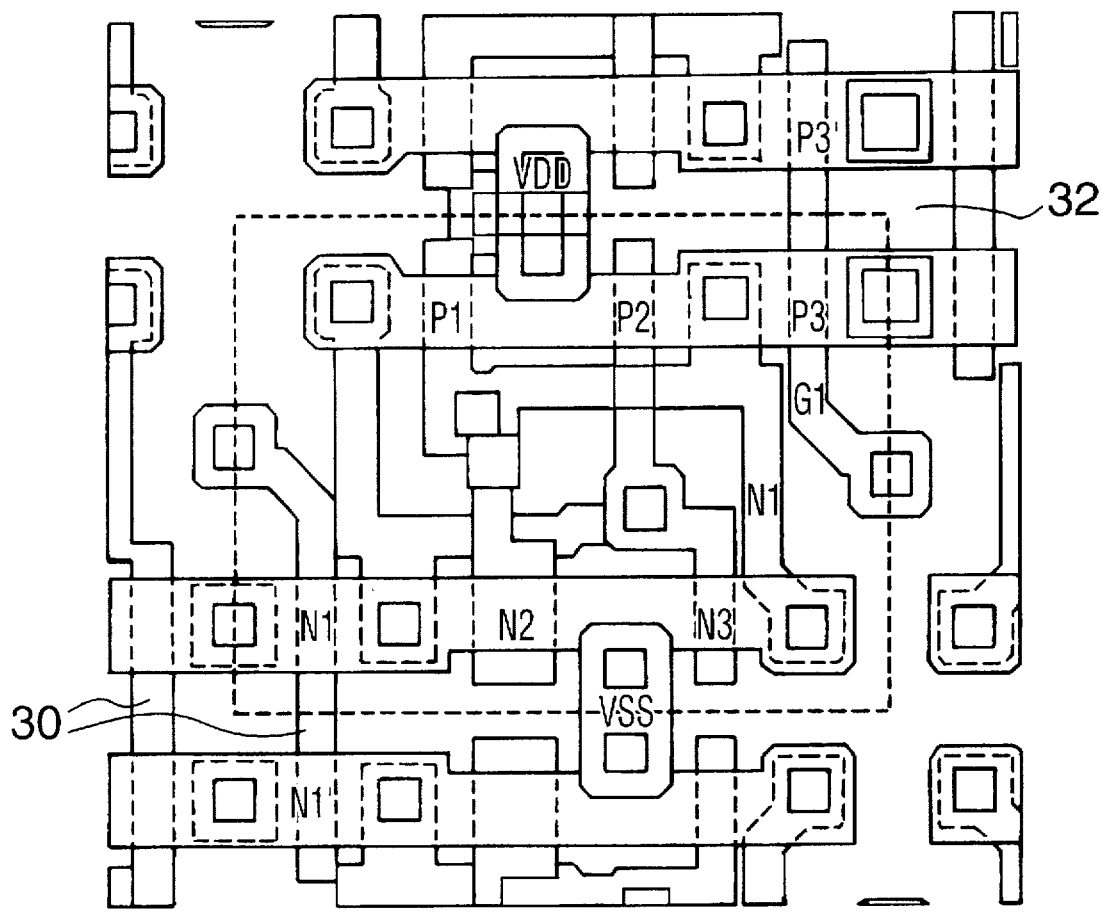
FIG. 5 is a diagram showing part of an array of SRAM cells which have been laid out in accordance with a preferred embodiment of the present invention, in which the top two metal layers have been removed for clarity.

FIG. 5 shows a cross-section of an array of SRAM cells of the type shown in FIG. 4. For clarity, the top two layers of metal have been separated out and shown in FIG. 6. The dashed line rectangle in these figures encloses a single SRAM memory cell. Again transistors (P1, P2, P3), and (N1, N2, N3) are each substantially in-line which allows the most compact transistor layout geometry.

In FIG. 5 special multiple cell connection lines 30 and 32 which connect pairs of transistors P3, P3' of the cell within the dotted line to an adjacent cell only a portion of which is shown at the top of the paper and pairs of transistors N1, N1' of the cell within the dotted line to an adjacent cell only a portion of which is shown at the bottom of the paper with similar connections shown for adjacent cells on each side of the cell within the dotted line, thereby permitting a further reduction in cell area.

Figure 6:
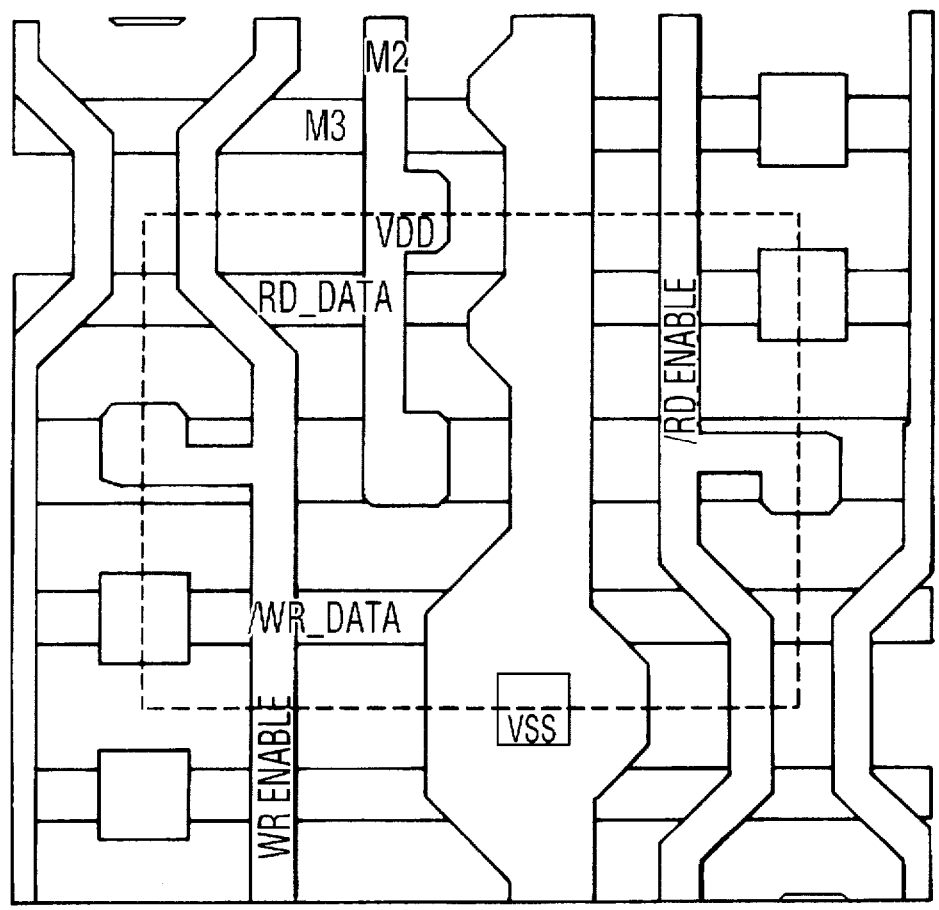
FIG. 6 is a schematic diagram showing part of an array of SRAM cells corresponding to that shown in FIG. 5 and in which only the top two metal layers are shown.

FIG. 6 shows the detail of the top two metal layers. Again, the dashed line identifies the boundary of a single cell. One of the metal layers, in this case the top layer, runs horizontally through the cell with 1 track each for RD_DATA, VDD, and WR_DATA. The other metal layer, in this case the second layer (M2), runs vertically through the cell with 1 track each for WR_ENABLE, VSS (ground), and RD_ENABLE. Both of these top two metal layers connect to lower level process layers through standard inter-layer contacts or vias.

Variations of this cell architecture are possible, but are topologically equivalent to this design. One such variation would be to reverse the rolls of transistors N1 and P3, as shown in FIG. 3. Another possible variation would be to add more transistors to provide additional read/write ports. Such transistors would increase the area of the cell, but could still take advantage of the primary layout, shown in FIGS. 4 and 5.

The minimum number of metal process layers used in this invention is three. Some new processes have four or more metal layers. This would provide more choice for the selection of metal layers, as shown in FIG. 6 but would not alter the layout method substantially.

Accordingly, while this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

I claim:

1. A static random access memory (SRAM) cell, comprising two NMOS transistors each having a source coupled to ground and a gate of each coupled to a drain of the other, and a pair of PMOS transistors serving as pullup devices each having a drain coupled to a drain of an associated one of said NMOS transistors, a source coupled to VDD and a gate coupled to the gate of the associated one of said NMOS transistors with a pair of data access transistors coupled between respective ones of two data lines to associated ones of the gates of said NMOS transistors with separate word lines coupled to gates of said two data access transistors, wherein one of said data access transistors being a PMOS transistor, wherein said three PMOS transistors are laid out so that the said PMOS transistors are substantially in-line and said three NMOS transistors are also laid out so that the said NMOS transistors are substantially in-line but spaced apart from said PMOS transistors.

2. A cell according to claim 1, wherein the number of metal process layers is three.

3. A cell according to claim 2, further including a around line running through a column of cells in one layer of metal, and a power (VDD) line running through a row of cells in a different layer of metal.

4. A cell according to claim 3, wherein separate single-ended read and write data lines run horizontally through each row of said cells together with said power (VDD) line and are formed from the same metal layer as said power line.

5. A static random access memory (SRAM) cell, comprising two NMOS transistors each having a source coupled to ground and a gate of each coupled to a drain of the other, and a pair of PMOS transistors serving as pullup devices each having a drain coupled to a drain of an associated one of said NMOS transistors, a source coupled to VDD and a date coupled to the rate of the associated one of said NMOS transistors with a pair of data access transistors, a NMOS data access transistor and a PMOS data access transistor, coupled between respective ones of two data lines to associated ones of the gates of said NMOS data access transistors with separate word lines, with a write enable line and a read enable line, said write enable line coupled to said NMOS data access transistor and said read enable line coupled to said PMOS data access transistor, including a ground line running vertically through a column of cells in one layer of metal, and a power (VDD) line running horizontally through all cells in one slice of a memory array, in a different layer of metal.

6. A cell according to claim 5, wherein said read and write enable lines each run vertically through each column of cells in a memory array and are formed from the same metal layer as said ground line.

7. A cell according to claim 6, wherein said read and write enable lines can be configured to form a single-port memory, or used separately, for a two port memory.

* * * * *

UNITED STATES PATENT AND TRADEMARK OFFICE
CERTIFICATE OF CORRECTION

PATENT NO. : 5,754,468
DATED : May 19, 1998
INVENTOR(S) : Richard F. Hobson

It is certified that error appears in the above-identified patent and that said Letters Patent is hereby corrected as shown below:

Column 2, line 4, delete "are" after "transistors".

Column 4, line 32, claim 3, delete "around" after second occurrence of "a" and substitute --ground--.

Column 4, line 46, claim 5, delete "date" before "coupled" and substitute --drain--; delete "rate" after first occurrence of "the" and substitute --gate--.

Signed and Sealed this

Twenty-seventh Day of June, 2000

Attest:

Q. TODD DICKINSON

Attesting Officer

Director of Patents and Trademarks